United States Patent
Deguchi et al.

(10) Patent No.: US 8,466,481 B2
(45) Date of Patent: Jun. 18, 2013

(54) SEMICONDUCTOR LIGHT-EMITTING DEVICE

(75) Inventors: Masashi Deguchi, Kiyosu (JP); Masao Kamiya, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/064,453

(22) Filed: Mar. 25, 2011

(65) Prior Publication Data
US 2011/0233588 A1  Sep. 29, 2011

(30) Foreign Application Priority Data

Mar. 26, 2010  (JP) ................. P.2010-071823

(51) Int. Cl.
*H01L 33/00* (2010.01)
(52) U.S. Cl.
USPC .......................................................... 257/98
(58) Field of Classification Search
None
See application file for complete search history.

(56) References Cited

U.S. PATENT DOCUMENTS

| | | | |
|---|---|---|---|
| 2006/0214168 A1* | 9/2006 | Akimoto et al. | 257/59 |
| 2007/0202624 A1* | 8/2007 | Yoon et al. | 438/29 |
| 2010/0012968 A1* | 1/2010 | Yahata et al. | 257/99 |
| 2010/0295086 A1 | 11/2010 | Shinohara et al. | |

FOREIGN PATENT DOCUMENTS

| | | | |
|---|---|---|---|
| CN | 101399307 A | | 4/2009 |
| CN | 101447545 A | | 6/2009 |
| JP | 10-341038 A | | 12/1998 |
| JP | 2006-128227 (A) | | 5/2006 |
| JP | 2008-227109(A) | | 9/2008 |
| JP | 2009-260237(A) | | 11/2009 |
| JP | 2009-302201(A) | | 12/2009 |
| JP | 2010-027824 (A) | | 2/2010 |
| JP | 2011204964 A | * | 10/2011 |

OTHER PUBLICATIONS

Abstract of Deguchi in English.*
Chinese Office Action dated Dec. 25, 2012 with English translation.
Japanese Office Action dated Jan. 15, 2013 with English translation thereof.

* cited by examiner

*Primary Examiner* — Nathan Ha
(74) *Attorney, Agent, or Firm* — McGinn IP Law Group, PLLC

(57) ABSTRACT

A first intermediate electrode 30 is a plural number of electrodes connecting to plural electrode forming parts formed in plural places, respectively on the surface of a first semiconductor layer 104. A second intermediate electrode 40 is a plural number of electrodes connecting to plural places of a transparent electrically conductive film 10, respectively. A first electrode 60 connects a plural number of the first intermediate electrodes 30 to each other, and a second electrode 70 connects a plural number of the second intermediate electrodes 40 to each other. The transparent electrically conductive film 10 is formed thin in a region A where a distance between the first intermediate electrode and the second intermediate electrode is the shortest, as compared with other regions.

20 Claims, 5 Drawing Sheets

SEMICONDUCTOR LIGHT-EMITTING DEVICE

BACKGROUND OF THE INVENTION

1. Field of the Invention

The present invention relates to a flip-chip type group III nitride semiconductor light-emitting device having an n-electrode and a p-electrode on the same surface side and capable of outputting light from the substrate side.

2. Background of the Invention

For example, in group III nitride semiconductor light-emitting devices, even when a p-type layer is subjected to a low-resistance treatment, since the p-type layer is higher in resistivity than an n-type layer, the current does not substantially spread in a lateral direction within the p-type layer, and light emission occurs only directly under the electrode. Thus, it is necessary to form an electrode layer over a wide range on the upper surface of the p-type layer. Also, in view of the fact that an insulating material such as sapphire is used as a substrate, it is necessary to form an electrode relative to the n-type layer as a lower layer on the upper surface of the device. In order to achieve this, there was taken a measure in which the p-type layer, the light-emitting layer and so on existing in an upper portion of an n-electrode forming region are removed by means of etching, an n-pad electrode for power supply is formed on the upper surface of the exposed n-type layer, a p-electrode is then formed, and a p-pad electrode for power supply is formed in a part on the p-electrode.

However, in particular, in flip-chip type group III nitride semiconductor light-emitting devices using a transparent electrically conductive film as the p-electrode and having a reflector provided in an upper part thereof, in the case where one n-pad electrode and one p-pad electrode are provided, it is difficult to allow the current to evenly diffuse in a surface direction in the transparent electrically conductive film, leading to a problem that an even current density is not obtained on the surface of the p-type layer. It is meant by this matter that there is a problem that the light emission on surface is not even and becomes non-uniform. Then, in order that the current supplied from the p-pad electrode may evenly flow in a horizontal direction on the surface of the transparent electrically conductive film, a technology described in the following Patent Document 1 is known.

According to the technology disclosed in the following Patent Document 1, a transparent electrically conductive film is formed in a comb-toothed shape where plural strips are arranged, plural intermediate electrodes which are connected to the respective strips in plural places are provided, and these plural intermediate electrodes and some p-bump electrodes for power supply are connected to each other. According to such a configuration, the current with an even current density is allowed to flow on the surface relative to the p-type layer.

Patent Document 1: JP-A-2010-27824

However, in the case of the structure of Patent Document 1, distances between the two n-intermediate electrodes and the respective p-intermediate electrodes formed on the transparent electrically conductive film are not equal, and taking into consideration the electrode-to-electrode potential distribution, a power line with a uniform density is not always formed. Accordingly, in order to supply a current with a uniform current density to the p-layer to realize uniform light emission, there is a limit even in the structure of Patent Document 1.

Also, there is a tendency that as the transparent electrically conductive film is formed thick in an even thickness, the sheet resistance becomes lower, and the current flowing in the horizontal direction on the surface of the transparent electrically conductive film diffuses and is made uniform. However, there is involved such a problem that as the transparent electrically conductive film is formed thick, the absorption of light by the film more increases, whereby the light extraction efficiency is lowered.

SUMMARY OF THE INVENTION

Then, in order to solve such problems, the invention has been made, and an object thereof is to achieve an enhancement of the light extraction efficiency, a lowering of the drive voltage and uniform light emission in a light-emitting device using a transparent electrically conductive film as an electrode.

A first invention is concerned with a flip-chip type semiconductor light-emitting device comprising a translucent substrate; a first semiconductor layer made of an n-type group III nitride semiconductor and stacked on the translucent substrate; a second semiconductor layer made of a p-type group HI nitride semiconductor; a transparent electrically conductive film formed on the second semiconductor layer; a reflector formed in an upper part of the transparent electrically conductive film; a second intermediate electrode connected to a place of a part of the transparent electrically conductive film; and a first intermediate electrode formed in an electrode forming part of the first semiconductor layer exposed upon being etched from the side of the second semiconductor layer, with light being outputted from the side of the translucent substrate, wherein the first intermediate electrode is a plural number of electrodes connecting to a plural number of the electrode forming parts formed in plural places, respectively on the surface of the first semiconductor layer; the second intermediate electrode is a plural number of electrodes connecting to plural places of the transparent electrically conductive film, respectively; a first electrode connecting a plural number of the first intermediate electrodes and a second electrode connecting a plural number of the second intermediate electrodes to each other are provided; and the transparent electrically conductive film is formed thin in a region where a distance between the first intermediate electrode and the second intermediate electrode is the shortest, as compared with other regions.

In the invention, the transparent electrically conductive film in the region where the distance between the first intermediate electrode and the second intermediate electrode is the shortest may be formed thin on average as compared with other portions. In consequence, in the invention, the transparent electrically conductive film may also be formed thin uniformly and evenly in the region where the distance between the first intermediate electrode and the second intermediate electrode is the shortest, as compared with other regions.

In the invention, the transparent electrically conductive film may also be a film in which plural concaves having a thin thickness are scattered in the region where the distance between the first intermediate electrode and the second intermediate electrode is the shortest.

In the invention, in the region where the distance between the first intermediate electrode and the second intermediate electrode is the shortest, the transparent electrically conductive film may also be a film in which its thickness is thinner than that in other regions, and plural convexes having a thick thickness are scattered in this region.

Here, the light-emitting device is used in the so-called flip-chip junction in which using the translucent substrate, the semiconductor layer side thereof is joined with a lead frame while facing the translucent substrate upward. The reflector may be formed directly on the transparent electrically conductive film, or the reflector may be formed while allowing an insulating film to intervene. The reflector may be made of a metal, or may be a multiple reflector composed of a dielectric multilayered film.

Also, the region where the distance between the first intermediate electrode and the second intermediate electrode is the shortest refers to a region existing between the electrodes, with a distance there between being the nearest, in the case of constituting a pair of one first intermediate electrode relative to of all of second intermediate electrodes. Examples of such a region include a region of an ellipse which does not include those two electrodes and in which a gap between the electrodes is the major axis; a region of a rectangle in which a gap between the electrodes is the long side; and a region of a polygon in which a gap between the electrodes is the long side, and a line segment connecting the electrodes to each other is objective. As for this combination, in the case where the first intermediate electrode is successively changed, each region where a distance of each of the first intermediate electrodes relative to the second intermediate electrode is the shortest is defined as described above. The whole of this region is formed thin evenly as compared with other regions, or plural pillar-shaped concaves for making the thickness thin are scattered in this region. In summary, this region may be formed thin on average as compared with other regions.

The group III nitride semiconductor refers to a semiconductor represented by the general formula: $Al_xGa_yIn_zN$ ($x+y+z=1$, $0 \leq x$, and y & $z \leq 1$) and includes those materials obtained by substituting a part of Al, Ga or In with B or Tl that is other group 3B element (group 13 element) or substituting a part of N with P, As, Sb or Bi that is other group 5B element (group 15 element). More generally, the group III nitride semiconductor refers to GaN, InGaN, AlGaN or AlGaInN, each of which contains at least Ga. Usually, Si is used as the n-type impurity, and Mg is used as the p-type impurity. In general, Si-doped n-type GaN is used in the first semiconductor layer, and Mg-doped p-type GaN is used in the second semiconductor layer. However, these are merely an example, and compound semiconductors having In added thereto, or having the foregoing arbitrary composition ratio are useful. The layer constitution of the semiconductor light-emitting device is arbitrary, and the composition ratio of the respective layers is also arbitrary.

As for the transparent electrically conductive film to be formed on the second semiconductor layer, so far as a certain arbitrary first intermediate electrode is concerned, in a pair of the first intermediate electrode relative to all second intermediate electrodes, in a region where a distance between the both electrodes is the shortest, the transparent electrically conductive film is formed thin as compared with other regions. From this fact, the resistance of the shortest passage between the first intermediate electrode and the second intermediate electrode becomes large, so that a current density flowing at the shortest distance can be reduced. That is, it is possible to diffuse the current flowing in a horizontal direction on the surface of the transparent electrically conductive film, thereby making the distribution on surface of the current density of the current flowing in the horizontal direction even. As a result, the light emission luminance can be made even on the surface.

DESCRIPTION OF THE PREFERRED EMBODIMENTS

Figure 1:
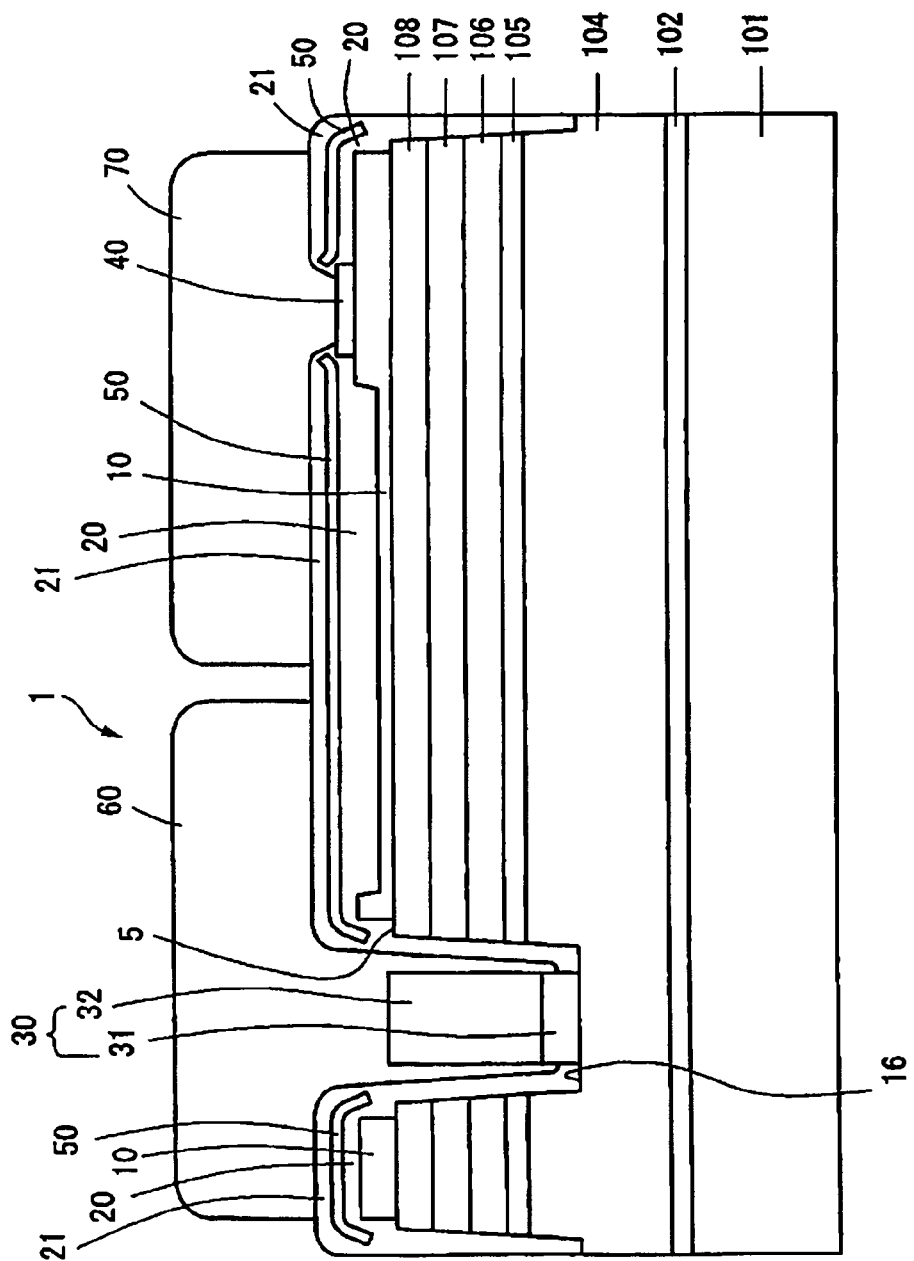
FIG. 1 is a sectional view of a semiconductor light-emitting device according to a specific embodiment of the invention.

Modes for carrying out the invention are described.

An arbitrary material is useful as the substrate so far as it is a translucent substrate. Examples thereof include sapphire ($Al_2O_3$).

Examples of the transparent electrically conductive film include metal oxides. Representatively, indium tin oxide (ITO) or zinc oxide (ZnO) may be used. Besides, transparent electrically conductive films made of a material obtained by adding ZnO with several % of an element which will become a trivalent ion as in $Al_2O_3$ or $Ga_2O_3$ (for example, AZO or GZO), fluorine-doped tin oxide (FTO), a complex of indium oxide and zinc oxide, niobium-added titanium dioxide $Ti_{1-x}Nb_xO_2$ (TNO) or other materials such as zinc oxide based materials, indium oxide based materials, tin oxide based materials and cadmium based materials (CTO) can be used. Though a material of each of the first electrode and the second electrode is arbitrary, gold, a multilayered film of gold and titanium or a eutectic alloy such as gold-tin (AuSn) can be used.

As a method for forming the transparent electrically conductive film, sputtering, vacuum vapor deposition and so on can be adopted. It is desirable that a single quantum well structure or a multiple quantum well structure constituting the light-emitting layer includes a well layer made of a group III nitride based compound semiconductor containing at least indium (In), which is represented by $Al_yGa_{1-y-z}In_zN$ ($0 \leq y < 1$ and $0 < z \leq 1$). Examples of the constitution of the light-emitting layer include a well layer made of doped or un-doped $Ga_{1-z}In_zN$ ($0 < z \leq 1$) and a barrier layer made of a group III nitride based compound semiconductor having a band gap larger than the well layer and having an arbitrary composition, which is represented by AlGaInN. Preferred examples thereof include a well layer made of un-doped $Ga_{1-z}In_zN$ ($0 < z \leq 1$) and a barrier layer made of un-doped GaN. Here, the term "doped" means that a dopant is incorporated intentionally into a raw material gas and added to the desired layer; and the term "un-doped" means that a dopant is not added intentionally without being incorporated into a raw material gas. In consequence, the term "un-doped" also includes the case where the doping is spontaneously made through diffusion from the near layer.

As a method for subjecting the group III nitride semiconductor layer to crystal growth, molecular beam epitaxy (MBE), metal-organic vapor phase epitaxy (MOVPE), hydride vapor phase epitaxy (HVPE), liquid phase epitaxy and so on are effective. The group III-V nitride semiconductor of each of the layers constituting the semiconductor light-emitting device can be formed of a group III-V nitride based compound semiconductor composed of a binary system, ternary system or quaternary system semiconductor which is at least represented by $Al_xGa_yInN$ ($0 \leq x \leq 1$, $0 \leq y \leq 1$, and $0 \leq x+y \leq 1$). Also, a part of such a group III element may be substituted with born (B) or thallium (Tl), and a part of nitrogen (N) may be substituted with phosphorus (P), arsenic (As), antimony (Sb) or bismuth (Bi).

Furthermore, in the case of forming an n-type layer using such a semiconductor, Si, Ge, Se, Te, C and so on can be added as n-type impurities, and in the case of forming a p-type layer, Be, Ca, Sr, Ba and so on can be added as p-type impurities.

(Embodiment 1)

Figure 2:
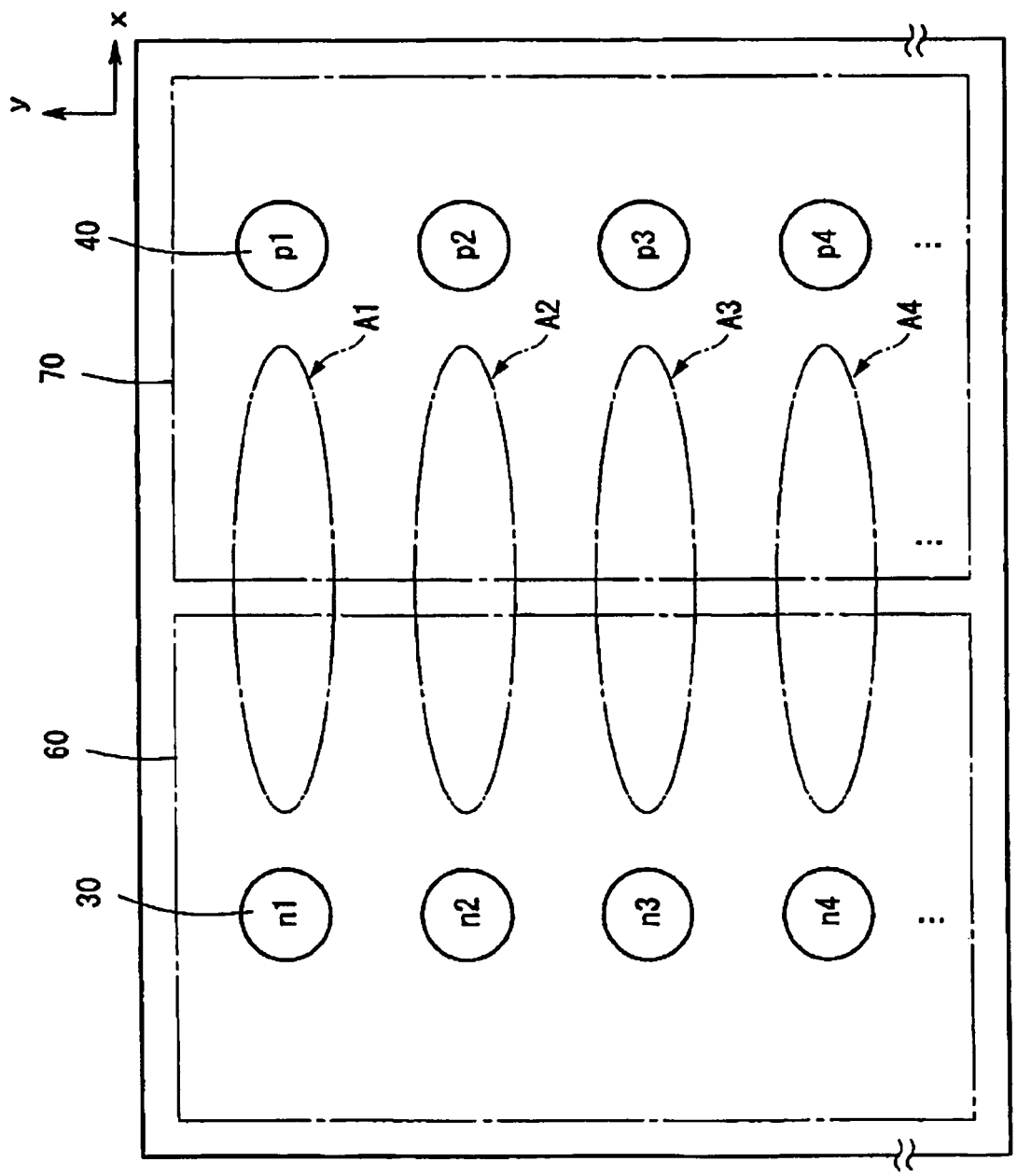
FIG. 2 is a plan view of the semiconductor light-emitting device of the foregoing specific embodiment.

FIG. 1 is a sectional view showing a semiconductor light-emitting device 1 of this Embodiment 1, and FIG. 2 is a plan view thereof. The semiconductor light-emitting device 1 is a flip-chip type light-emitting diode (LED) capable of emitting light having a wavelength of a blue region. When a forward voltage is 3.2 V, and a forward current is 350 mA, this semiconductor light-emitting device 1 emits light having a peak wavelength of 450 nm. Also, the semiconductor light-emitting device 1 is formed in a rectangular shape in a tope view. As for the planar dimension of the light-emitting device 1, one side is approximately 1,000 μm, and other side is approximately 500 μm. A buffer layer 102 made of aluminum nitride (AlN) and having a film thickness of about 20 nm is formed on a sapphire substrate 101 having a thickness of 100 μm, and an n-type contact layer 104 (first semiconductor layer) that is a high-carrier concentration $n^+$ layer made of silicon (Si)-doped GaN and having a film thickness of about 8.0 μm is formed on the layer 102. This n-type contact layer 104 has an electron density of $5\times10^{18}$/cm$^3$. Though it is desirable that the electron density of this layer is as high as possible, it is possible to increase the electron density to $2\times10^{19}$/cm$^3$. Then, an electrostatic discharge resistance improvement layer (ESD layer) 105 is formed on the n-type contact layer 104. The ESD layer 105 has a three-layered structure of a first ESD layer, a second ESD layer and a third ESD layer from the side of the n-type contact layer 104. The first ESD layer is made of n-GaN having an Si concentration of from $1\times10^{16}$ to $5\times10^{17}$/cm$^3$. A thickness of the first ESD layer is from 200 to 1,000 nm. Also, though a small number of pits are generated due to threading dislocation on the surface of the first ESD layer, a pit density thereof is not more than $1\times10^8$/cm$^2$. The second ESD layer is made of non-doped GaN. A thickness of the second ESD layer is from 50 to 200 nm. Pits are also generated on the surface of the second ESD layer, and a pit density thereof is $2\times10^8$/cm$^2$ or more. Though the second ESD layer is non-doped, its carrier concentration is from $1\times10^{16}$ to $1\times10^{17}$/cm$^3$ due to the residual carrier. In the second ESD layer, Si may be doped within a range where the carrier concentration is not more than $5\times10^{17}$/cm$^3$. The third ESD layer is made of Si-doped GaN and has a characteristic value as defined by the product of the Si concentration (/cm$^3$) and the film thickness (nm) of from $0.9\times10^{20}$ to $3.6\times10^{20}$ (nm/cm$^3$). For example, when the thickness of the third ESD layer is 30 nm, the Si concentration is from $3.0\times10^{18}$ to $1.2\times10^{19}$/cm$^3$.

A light-emitting layer 106 having a multiple quantum well structure (MQW) in which three cycles composed of non-doped GaN having a film thickness of 20 nm and non-doped $Ga_{0.8}In_{0.2}N$ having a film thickness of 3 nm are stacked is formed on the ESD layer 105. A p-type layer 107 corresponding to a clad layer made of magnesium (Mg)-doped $Al_{0.15}Ga_{0.85}N$ and having a film thickness of about 60 nm is formed on the light-emitting layer 106. Furthermore, a p-type contact layer 108 (second conductor layer) made of magnesium (Mg)-doped GaN and having a film thickness of about 130 nm is formed on the p-type layer 107.

Also, a transparent electrically conductive film 10 made of ITO and formed by means of sputtering or vacuum vapor deposition is formed on the p-type contact layer 108. A first insulating protective film 20 made of $SiO_2$ is formed on the transparent electrically conductive film 10. A thickness of the transparent electrically conductive film 10 is 0.3 μm in a thick portion and 0.1 μm in a thin portion, respectively. The first insulating protective film 20 has a thickness of 0.3 μm. A reflector 50 made of Al is formed in a thickness of 0.1 μm on the first insulating protective film 20. A second insulating protective film 21 is formed thereon in a thickness of 0.3 μm. In consequence, the reflector 50 is embedded in an insulating protective film having the first insulating protective film 20 and the second insulating protective film 21 integrated therein. Also, in plural places, second intermediate electrodes 40, each of which is joined with the transparent electrically conductive film 10, are respectively formed in plural windows opened threading through the first insulating protective film 20, the second insulating protective film 21 and the reflector 50. The second intermediate electrode 40 is constituted of a double structure of titanium (Ti) having a thickness of 0.01 μm and gold (Au) having a thickness of 0.5 μm. Also, the second intermediate electrode 40 may be constituted of an alloy of Ti and Au.

Meanwhile, a first intermediate electrode 30 is formed on the n-type contact layer 104 exposed upon being etched from the p-type contact layer 108. The first intermediate electrode 30 has a double structure and is constituted by successively stacking a vanadium (V) layer 31 having a film thickness of about 18 nm and an aluminum (Al) layer 32 having a film thickness of about 1.8 μm on an electrode forming part 16 that is a partially exposed portion of the n-type contact layer 104. Then, a second electrode 70 having a rectangular shape so as to connect the plural second intermediate electrodes 40 to each other and a first electrode 60 having a rectangular shape so as to connect the plural first intermediate electrodes 30 to each other are disposed on the second insulating protective film 21. These second electrode 70 and first electrode 60 form a bump to be connected to a lead frame.

A planar shape obtained by horizontally cutting the semiconductor light-emitting device 1 at the position of the transparent electrically conductive film 10 is shown in FIG. 2 and has a rectangular shape that is long in the x-axis direction. A plural number of the second intermediate electrodes 40 are disposed at plural positions on the plane surface of the transparent electrically conductive film 10 along the long side. Also, a plural number of the first intermediate electrodes 30 are disposed at plural positions on the plane surface of the n-type contact layer 104. As for all of the plural second intermediate electrodes 40, the positions in the short-side direction (x-axis direction) are equal; and as for all of the plural first intermediate electrodes 30, the positions in the short-side direction are equal. Also, each of the second intermediate electrodes 40 and each of the first intermediate electrodes 30 constitute the same pair in which the positions in the long-side direction (y-axis direction) are equal.

When a pair of arbitrary one of the first intermediate electrodes 30 relative to all of the second intermediate electrodes 40 is taken into consideration, the second intermediate electrode 40 in which the distance between the both electrodes is the nearest can be determined. Then, when a pair of the both electrodes is similarly taken into consideration while changing the first intermediate electrode 30 one-by-one, the second intermediate electrode 40 having the nearest distance relative to each of the first intermediate electrodes 30 can be respectively determined. In consequence, in all of combinations between the first intermediate electrode 30 and the second intermediate electrode 40, electrode pairs having the nearest distance between the both electrodes, i.e., (n1, p1), (n2, p2), (n3, p3), (n4, p4), . . . , are present in a number corresponding to the number of the first intermediate electrodes 30. In FIG. 2, four pairs of electrodes are illustrated. The transparent electrically conductive film 10 of nearest neighboring regions A1 to A4 having an elliptical shape free from the first intermediate electrode 30 and the second intermediate electrode 40 is formed thin in a thickness of 0.1 μm, and other regions are formed thick in a thickness of 0.3 μm. In the nearest neighboring regions A1 to A4, since the transparent electrically conductive film 10 is thin, the sheet resistance is large as compared with other regions. Thus, a current density flowing in the horizontal direction on the surface is small as compared with other regions. In consequence, the current density flowing in the horizontal direction on the surface of the transparent electrically conductive film 10 between the pair electrodes of the second intermediate electrode 40 and the first intermediate electrode 30 is made uniform and even. As a result, the distribution on surface of the current density flowing on the light-emitting layer 106 in the vertical direction becomes even, and the light emission distribution becomes even.

In the light of the above, when the transparent electrically conductive film 10 is not made thin, the current is concentrated in the nearest neighboring regions A1 to A4 of the transparent electrically conductive film 10, whereas when the transparent electrically conductive film 10 in the nearest neighboring regions A1 to A4 is made thin, the concentration of the current in the nearest neighboring regions A1 to A4 is relieved, and even current distribution is obtained on the surface. Also, since these nearest neighboring regions A1 to A4 are positioned in the center of the light-emitting surface of the semiconductor light-emitting device, an optical loss in the center by the transparent electrically conductive film 10 can be reduced. Furthermore, since the transparent electrically conductive film in other regions than the nearest neighboring regions A1 to A4 is formed thick, the drive voltage of the semiconductor light-emitting device is not increased.

Next, a manufacturing method of the present semiconductor light-emitting device is described. First of all, the buffer layer 102 by low-temperature epitaxy of aluminum nitride (AlN) is formed on the sapphire substrate 101 at 400° C. by means of MOCVD. Subsequently, the n-type contact layer 104, the ESD layer 105, the light-emitting layer 106, the p-type layer 107 and the p-type contact layer 108, each of which is made of a group III nitride semiconductor by epitaxial growth of each group III nitride semiconductor, are successively stacked by means of MOCVD while adjusting to an optimal temperature. As for the raw material gases in the MOCVD, ammonia ($NH_3$) is used as a nitrogen source; trimethylgallium ($Ga(CH_3)_3$) is used as a Ga source; trimethylindium ($In(CH_3)_3$) is used as an In source; trimethylaluminum ($Al(CH_3)_3$) is used as an Al source; silane ($SiH_4$) is used as an n-type doping gas; cyclopentadienylmagnesium (Mg $(C_5H_5)_2$) is used as a p-type doping gas; and $H_2$ or $N_2$ is used as a carrier gas.

The foregoing epitaxial growth of the semiconductor layer is a well known method. The respective layers are epitaxially grown on the sapphire substrate 101. Subsequently, ITO is evenly deposited in a thickness of 0.3 μm on the entire surface of the p-type contact layer 108, thereby forming the transparent electrically conductive film 10. Subsequently, a photo-resist is coated on the entire surface of the transparent electrically conductive film 10, and a portion corresponding to the electrode forming part 16 of the n-type contact layer 104 of FIG. 1 is exposed and developed to form a window in that portion. Then, dry etching is performed while using the remaining transparent electrically conductive film 10 and the photo-resist as a mask, to expose the n-type contact layer 104, thereby forming the electrode forming part 16. Subsequently, after the photo-resist is removed, a photo-resist is coated on the whole of the upper surface of this device, and portions of the nearest neighboring regions A1 to A4 of FIG. 2 are exposed and developed, thereby forming windows in those portions. Then, the transparent electrically conductive film 10 is dry etched in a depth of only 0.2 μm, thereby making the transparent electrically conductive film 10 of the nearest neighboring regions A1 to A4 thin in a thickness of 0.1 μm.

In the subsequent steps, the respective layers are formed adopting photolithography as well known in the art. That is, the first insulating protective film 20, the reflector 50 and the second insulating protective film 21 exclusive of the first intermediate electrode 30 and the second intermediate electrode 40 are successively deposited. Subsequently, the first intermediate electrode 30 to be joined with the n-type contact layer 104 and the second intermediate electrode 40 to be joined with the transparent electrically conductive film 10 are similarly deposited by means of photolithography. Subsequently, the first electrode 60 so as to connect the plural first intermediate electrodes 30 to each other and the second electrode 70 so as to connect the plural second intermediate electrodes 40 to each other are deposited, thereby completing the semiconductor light-emitting device.

As for the method for forming the transparent electrically conductive film 10 of the nearest neighboring regions A1 to A4, the following method may be adopted, too. The transparent electrically conductive film 10 made of ITO is evenly formed in a thickness of 0.2 μm on the p-type contact layer 108. Subsequently, a photo-resist is coated on the entire surface of the transparent electrically conductive film 10, and the portions of the nearest neighboring regions A1 to A4 of FIG. 2 are exposed and developed to form windows in those portions. Then, the remaining photo-resist is used as a mask, and all of the transparent electrically films 10 of the windows are removed. Subsequently, after the photo-resist is removed, ITO is evenly deposited in a thickness of 0.1 μm, thereby forming the transparent electrically conductive film 10. According to this, the transparent electrically conductive films 10 of the nearest neighboring regions A1 to A4 can be made to have a thickness of 0.1 μm, while making other portions have a thickness of 0.3 μm.

Also, as for the method for forming the transparent electrically conductive film 10 of the nearest neighboring regions A1 to A4 thin, the following method may be adopted, too. The transparent electrically conductive film 10 made of ITO is evenly formed in a thickness of 0.1 μm on the p-type contact layer 108. Subsequently, a photo-resist is coated on the entire surface of the transparent electrically conductive film 10, and other portions than the nearest neighboring regions A1 to A4 of FIG. 2 are exposed and developed, thereby remaining the photo-resist only in the nearest neighboring regions A1 to A4. Then, ITO is further deposited in a thickness of 0.2 μm in this state. Thereafter, the photo-resist is lifted off. According to this, the transparent electrically conductive films 10 of the nearest neighboring regions A1 to A4 can be made to have a thickness of 0.1 μm, while making other portions have a thickness of 0.3 μm.

Figure 3:
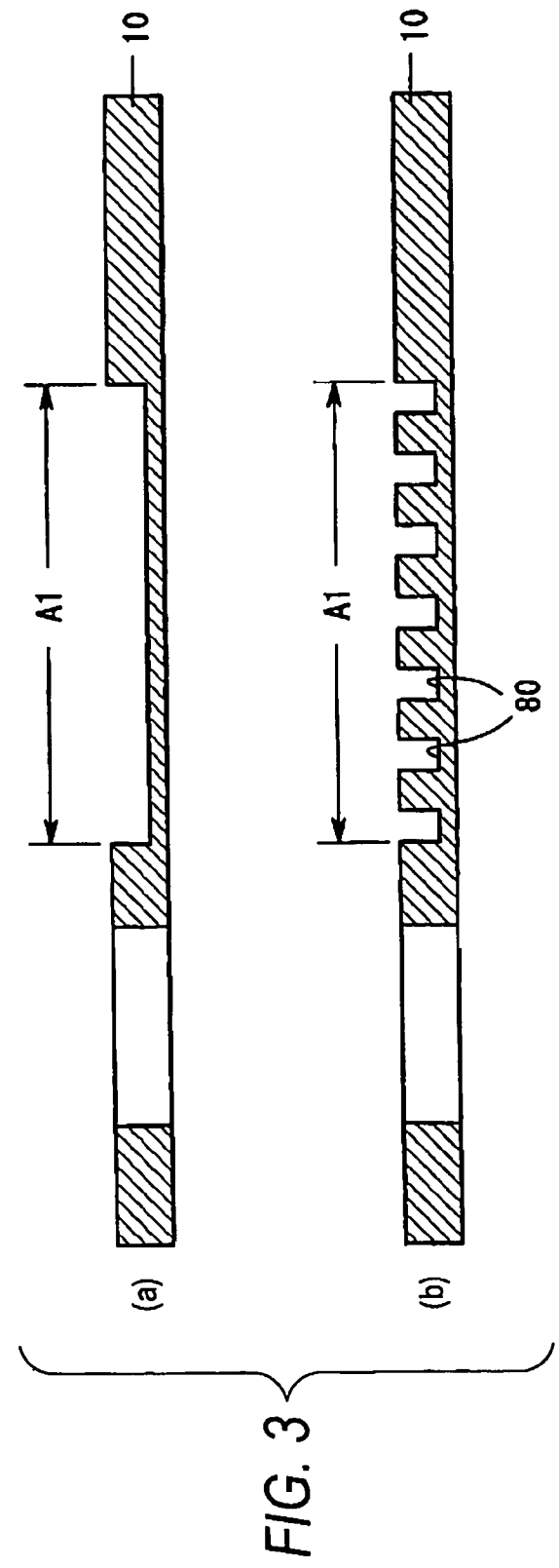
FIGS. 3A and 3B are a sectional view showing a constitution of every sort of a transparent electrically conductive film used in a semiconductor light-emitting device according to an embodiment.
Figure 4:
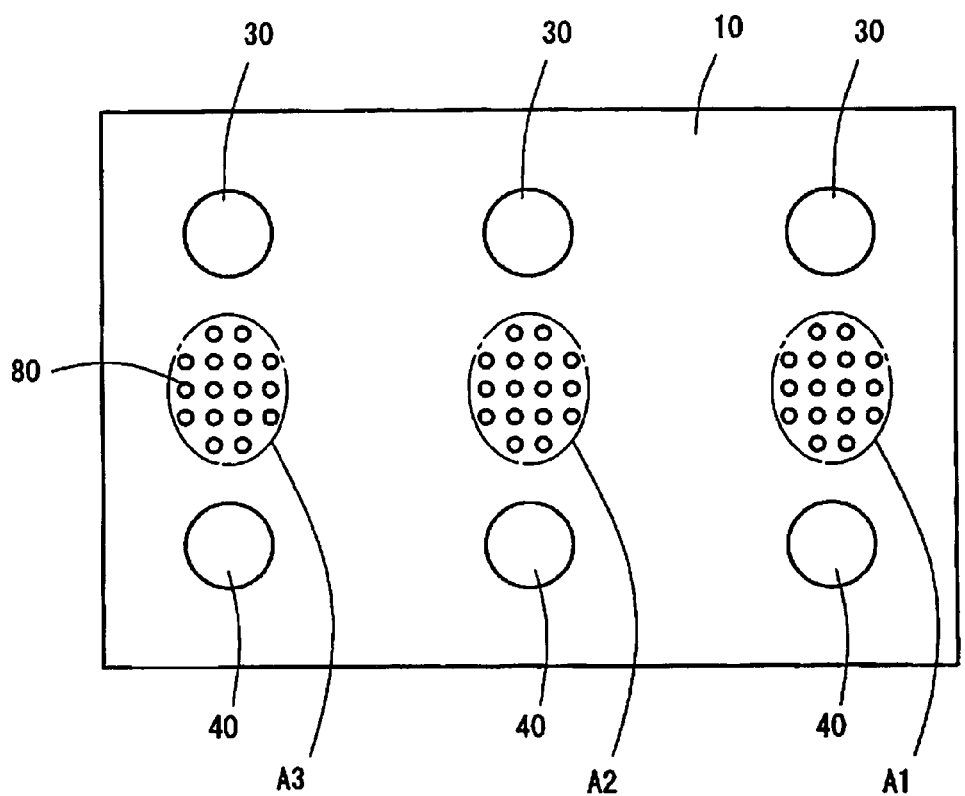
FIG. 4 is a plan view showing a constitution of a semiconductor light-emitting device according to other embodiment.

In the foregoing Embodiment 1, as shown in FIG. 3A, the structure in the nearest neighboring regions A1 to A4 of the transparent electrically conductive film 10 is made thin evenly and uniformly as compared with other portions. However, as shown in a sectional view shown in FIG. 3B and a plan view shown in FIG. 4, a large number of columnar concaves 80 may be scattered. A diameter of the concave is 5 μm, and a concave-to-concave cycle is 20 μm. In this way, the thickness of the nearest neighboring regions A1 to A4 may be made thin on average. In that case, irregular reflection of the light is promoted by irregularities, thereby enabling the light extraction efficiency to be enhanced. The concaves can be used so as to have a diameter of 0.5 μm or more and not more than 20 μm and a cycle of 0.5 μm or more and not more than 100 μm.

Figure 5:
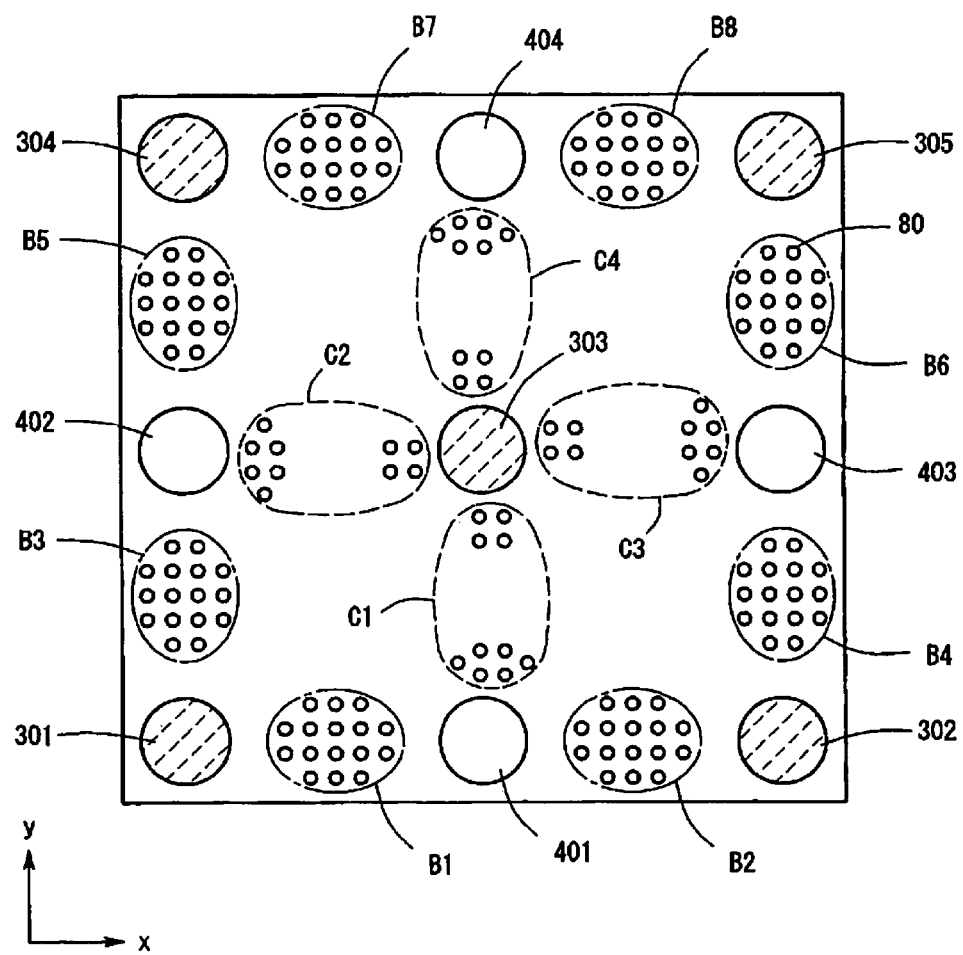
FIG. 5 is a plan view showing a constitution of a semiconductor light-emitting device according to other embodiment.

A relation among the nearest neighboring regions A1 to A4, the first intermediate electrode 30 and the second intermediate electrode 40 may be one shown in FIG. 5. In the case of FIG. 5, five first intermediate electrodes 301 to 305 and four second intermediate electrodes 401 to 404 are provided. The first intermediate electrode 301, the second intermediate electrode 401 and the first intermediate electrode 302 are alternately disposed at a position of the lowermost stage on the same y-coordinate in a direction toward which the x-coordinate increases. Also, the second intermediate electrode 402, the first intermediate electrode 303 and the second intermediate electrode 403 are alternately disposed at a position of the middle stage on the same y-coordinate in a direction toward which the x-coordinate increases. Also, the first intermediate electrode 304, the second intermediate electrode 404 and the first intermediate electrode 305 at a position of the uppermost stage on the same y-coordinate in a direction toward which the x-coordinate increases. Then, the columnar concaves 80 are scattered and provided in nearest neighboring regions B1 to B8 where an electrode-to-electrode distance is the shortest, for example, a gap between the first intermediate electrode 301 and the second intermediate electrode 401, a gap between the first intermediate electrode 301 and the second intermediate electrode 402, etc., among the pairs of each first intermediate electrode and each second intermediate electrode. A scattered pattern of the concaves 80 in these eight nearest neighboring regions B is identical. Also, the columnar concaves 80 are scattered and provided in four regions of nearest neighboring regions C1, C2, C3 and C4 where an electrode-to-electrode distance is the shortest in a gap between the first intermediate electrode 303 positioning in the center of the transparent electrically conductive film 10 and the second intermediate electrode 401 in the lowermost stage, a gap between the first intermediate electrode 303 and the second intermediate electrode 402 in the middle stage, a gap between the first intermediate electrode 303 and the second intermediate electrode 403 in the middle stage and a gap between the first intermediate electrode 303 and the second intermediate electrode 404 in the uppermost stage. Though a scattered pattern of the concaves 80 in these four nearest neighboring regions C is identical, this scattered pattern is different from the scattered pattern of the concaves 80 in the nearest neighboring regions B, and the density of the concaves 80 is small. Even by taking such an approach, it is possible to make the current density distribution flowing in the horizontal direction on the surface of the transparent electrically conductive film 10 uniform.

In the foregoing Embodiment 1, though the first insulating protective film 20 and the second insulating protective film 21 are formed of silicon dioxide ($SiO_2$), they can also be formed of a metal oxide such as titanium oxide ($TiO_2$), alumina ($Al_2O_3$) and tantalum pentoxide ($Ta_2O_5$) or a resin material having electrically insulating properties such as polyimides. Also, in the foregoing Embodiment 1, though Al is used for the reflector 50, the reflector 50 can also be formed of an alloy containing Al or Ag as a major component. Besides, the reflector 50 may be formed of silver (Ag), rhodium (Rh), ruthenium (Ru), platinum (Pt), palladium (Pd) or an alloy containing at least one kind of these metals. Also, the reflector 50 may be a distributed Bragg reflector (DBR) formed from plural layers of two materials having a different refractive index from each other.

The second intermediate electrode 40 may be constituted of three layers of an Ni layer, an Au layer and an Al layer, each of which is joined with the transparent electrically conductive film 10. The first electrode 60 and the second electrode 70 as a bump electrode made of an AuSn eutectic alloy, the surface of which is made of Au, are joined with the first intermediate electrode 30 and the second intermediate electrode 40, respectively via a first layer made of Ti, a second layer made of Ni, respectively, a third layer made of Ti and a fourth layer made of Ni. Ti of each of the first layers increases a joining strength between the first intermediate electrode 30 and the second intermediate electrode 40. The second to fourth layers are a layer for preventing the diffusion of Sn of solder. Also, at least one kind of metals selected from the group consisting of Ti, Al, Pd, Pt, V, Ir and Rh can be used as the first intermediate electrode 30. The first electrode 60 and the second electrode 70 can be formed by means of plating, screen printing, sputtering, vacuum vapor deposition or the like. The transparent electrically conductive film 10 can also be formed by means of sputtering, CVD, vacuum vapor deposition or the like.

The invention can be applied to a light-emitting layer for making the light emission luminance on the surface uniform.

What is claimed is:

1. A flip-chip type semiconductor light-emitting device, comprising:
    a translucent substrate;
    a first semiconductor layer comprising an n-type group III nitride semiconductor and stacked on the translucent substrate;
    a second semiconductor layer comprising a p-type group HI nitride semiconductor;
    a transparent electrically conductive film formed on the second semiconductor layer;
    a reflector formed above the transparent electrically conductive film;
    a second intermediate electrode connected to the transparent electrically conductive film;
    a first intermediate electrode formed in an electrode forming part of the first semiconductor layer exposed upon being etched from a side of the second semiconductor layer, with light being outputted from a side of the translucent substrate,
        wherein the first intermediate electrode comprises a plural number of electrodes connecting to a plural numbers of the electrode forming part formed in plural places, respectively on a surface of the first semiconductor layer, and
        wherein the second intermediate electrode comprises a plural number of electrodes connecting to plural places of the transparent electrically conductive film, respectively;
    a first electrode connecting a plural numbers of the first intermediate electrode; and
    a second electrode connecting a plural numbers of the second intermediate electrode to each other,
        wherein the transparent electrically conductive film is thinner in a region where a distance between the first intermediate electrode and the second intermediate electrode is shortest, as compared with other regions of the transparent electrically conductive film.

2. The semiconductor light-emitting device according to claim 1, wherein the transparent electrically conductive film is formed thin evenly in the region where the distance between the first intermediate electrode and the second intermediate electrode is shortest, as compared with the other regions of the transparent electrically conductive film.

3. The semiconductor light-emitting device according to claim 1, wherein the transparent electrically conductive film comprises a film that comprises plural concaves having a thin thickness and are scattered in the region where the distance between the first intermediate electrode and the second intermediate electrode is shortest.

4. The semiconductor light-emitting device according to claim 1, wherein the region where the distance between the first intermediate electrode and the second intermediate electrode is shortest has an elliptical shape.

5. The semiconductor light-emitting device according to claim 1, wherein the semiconductor light-emitting device comprises a plurality of ones of the region where the distance between the first intermediate electrode and the second intermediate electrode is shortest.

6. The semiconductor light-emitting device according to claim 1, wherein, in a plan view, the first electrode and the second electrode overlap with the region where the distance between the first intermediate electrode and the second intermediate electrode is shortest.

7. The semiconductor light-emitting device according to claim 1, wherein, in a plan view, an area between one of the plural numbers of the first intermediate electrode and an opposing one of the plural numbers of the second intermediate electrodes comprises:
   the region where the distance between the first intermediate electrode and the second intermediate electrode is shortest; and
   the other regions of the transparent electrically conductive film.

8. The semiconductor light-emitting device according to claim 1, wherein each of the plural numbers of the first intermediate electrode opposes a corresponding one of the plural numbers of the second intermediate electrode, which is different from remaining ones of the of the plural numbers of the second intermediate electrode.

9. The semiconductor light-emitting device according to claim 1, further comprising:
   a first insulating protective film disposed on the transparent electrically conductive film, said reflector being disposed above the first insulating protective film; and
   a second insulating protective film disposed above the reflector.

10. The semiconductor light-emitting device according to claim 1, further comprising a window opened in the reflector, the second intermediate electrode being located in the window.

11. The semiconductor light-emitting device according to claim 1, wherein the region where the distance between the first intermediate electrode and the second intermediate electrode is shortest comprises a plurality of regions disposed inside the other regions of the transparent electrically conductive film.

12. The semiconductor light-emitting device according to claim 1, wherein each of the plurality of the regions extends from the first electrode to the second electrode.

13. The semiconductor light-emitting device according to claim 1, further comprising:
   an insulating protective film disposed above the reflector, wherein the first electrode and the second electrode are disposed on an upper surface of the insulating protective film.

14. A semiconductor light-emitting device, comprising:
   a translucent substrate;
   a first semiconductor layer comprising an n-type semiconductor and being disposed on the translucent substrate;
   a second semiconductor layer comprising a p-type semiconductor;
   a transparent electrically conductive film formed on the second semiconductor layer;
   a reflector formed above the transparent electrically conductive film;
   a plurality of first intermediate electrodes formed on the first semiconductor layer;
   a plurality of second intermediate electrodes formed on the transparent electrically conductive film;
   a first electrode connecting the first intermediate electrodes to each other; and
   a second electrode connecting the second intermediate electrodes to each other,
   wherein the transparent electrically conductive film comprises a region where a distance between one of the first intermediate electrodes and a corresponding one of the second intermediate electrodes is shortest, said region being thinner as compared with a remaining region of the transparent electrically conductive film.

15. The semiconductor light-emitting device according to claim 14, wherein the semiconductor light-emitting device comprises a plurality of ones of the region, and
   wherein the plurality of ones of the region is disposed inside the remaining region of the transparent electrically conductive film.

16. The semiconductor light-emitting device according to claim 14, wherein, in a plan view, the first electrode and the second electrode overlap with said region.

17. The semiconductor light-emitting device according to claim 14, wherein, in a plan view, an area between said one of the first intermediate electrodes and said corresponding one of the second intermediate electrodes comprises the region and the remaining region.

18. The semiconductor light-emitting device according to claim 14, wherein each of the first intermediate electrodes pairs with each of the second intermediate electrodes, said each of the second intermediate electrodes being different from remaining ones of the second intermediate electrodes.

19. The semiconductor light-emitting device according to claim 14, further comprising:
   a first insulating protective film disposed on the transparent electrically conductive film, said reflector being disposed above the first insulating protective film; and
   a second insulating protective film disposed above the reflector,
   wherein the first electrode and the second electrode are disposed on an upper surface of the second insulating protective film.

20. The semiconductor light-emitting device according to claim 14, further comprising a plurality of windows opened in the reflector, the second intermediate electrodes being located in the windows.

* * * * *